(12) United States Patent
Terahara et al.

(10) Patent No.: US 8,382,343 B2
(45) Date of Patent: Feb. 26, 2013

(54) ELECTRONIC DEVICE

(75) Inventors: Noriaki Terahara, Osaka (JP); Seiji Hoshi, Osaka (JP); Yoshiyuki Hashimoto, Osaka (JP); Takeshi Ohta, Osaka (JP); Toshiyasu Tanaka, Osaka (JP); Yasuo Ueda, Kadoma (JP); Toshiaki Takasu, Osaka (JP)

(73) Assignee: Panasonic Corporation, Kadoma-shi (JP)

( * ) Notice: Subject to any disclaimer, the term of this patent is extended or adjusted under 35 U.S.C. 154(b) by 312 days.

(21) Appl. No.: 12/960,564

(22) Filed: Dec. 6, 2010

(65) Prior Publication Data

US 2012/0020095 A1 Jan. 26, 2012

(30) Foreign Application Priority Data

Dec. 9, 2009 (JP) ................................. 2009-279156

(51) Int. Cl.
*F21V 29/00* (2006.01)
*H05K 7/20* (2006.01)
(52) U.S. Cl. ......................... 362/382; 362/294; 361/720
(58) Field of Classification Search .................. 362/294, 362/311.02, 382; 361/679.46, 679.84, 720
See application file for complete search history.

(56) References Cited

U.S. PATENT DOCUMENTS 5,280,409 A * 1/1994 Selna et al. .................... 361/720

FOREIGN PATENT DOCUMENTS

| JP | H05-259666 A | 10/1993 |
| JP | H08-23182 A | 1/1996 |
| JP | H09-27690 A | 1/1997 |
| JP | H11-68276 A | 3/1999 |
| JP | 2007-242711 A | 9/2007 |
| JP | 2009-223881 A | 10/2009 |

* cited by examiner

*Primary Examiner* — David V Bruce
(74) *Attorney, Agent, or Firm* — Judge Patent Associates (57) ABSTRACT

In an electronic device including a temperature sensor and an electronic component which is a heat generation source, the temperature is measured while the influence of heat from the electronic component is reduced. The electronic device includes: a base formed of a resin material; a board which is disposed at one side of the base, and includes an electronic component and a temperature sensor; and a heat sink which is disposed at the other side of the base for dissipating heat generated by the electronic component. The heat sink includes an extension part extending from the other side of the base toward a position of the board at which the electronic component is provided.

9 Claims, 14 Drawing Sheets

ELECTRONIC DEVICE

CROSS REFERENCE TO RELATED APPLICATION

The disclosure of Japanese Patent Application No. 2009-279156, filed Dec. 9, 2009, is incorporated herein by reference.

BACKGROUND OF THE INVENTION

1. Field of the Invention

The present invention relates to an electronic device equipped with an electronic component and a temperature sensor, and particularly to an electronic device that reduces the influence of heat generated by the electronic component upon the temperature sensor.

2. Description of the Background Art

Japanese Laid-Open Patent Publication NO. H05-259666 (Patent Literature 1) discloses a technique of improving the heat dissipation effect for a motor IC.

Patent Literature 1 discloses a printed circuit board having a motor IC mounted thereon. On the surface opposite of the board from the surface on which the motor IC is mounted, a heat sink is provided. The heat sink is arranged at a cutout portion of the printed circuit board in a bent manner.

Meanwhile, there is a case where a temperature sensor is provided on the printed circuit board. In such a case, heat generated by the electronic components on the printed circuit board may affect the temperature sensor, which may negatively affect accurate temperature measurement.

SUMMARY OF THE INVENTION

An object of the present invention is to provide an electronic device which includes electronic components and a temperature sensor, and which reduces the influence of heat generated by the heat source, i.e., the electronic components, on the temperature sensor.

The electronic device of the present invention includes: a base formed of a resin material; a board which is disposed at one side of the base, and includes an electronic component and a temperature sensor; and a heat sink which is disposed at the other side of the base for dissipating heat generated by the electronic component. The heat sink includes an extension part extending from the other side of the base toward a position of the board at which the electronic component is provided.

According to the present invention, in the electronic device equipped with a temperature sensor, it is possible to reduce influence of heat from the heat source, i.e., the electronic components, on the temperature sensor.

DESCRIPTION OF THE PREFERRED EMBODIMENTS

First Embodiment

A first embodiment of the present invention will be described with reference to the drawings. An optical pickup will be described as one example of electronic devices according to the present invention. It should be noted that the electronic devices of the present invention are such devices that require a temperature sensor, and are typified by, for example, optical pickups, air conditioners, cooking devices, and the like.

1. Definition

In an optical pickup 1 according to this embodiment, the side at which an optical disc is installed is defined as a disc side, whereas the side opposite to the side at which the optical disc is installed in the optical pickup is defined as a bottom surface side.

In this embodiment, description will be made by referring to one side and the other side of a pickup-base constituting an electronic device (optical pickup 1). One side of the pickup-base is an example of the disc side, and the other side is an example of the bottom surface side.

Figure 3:
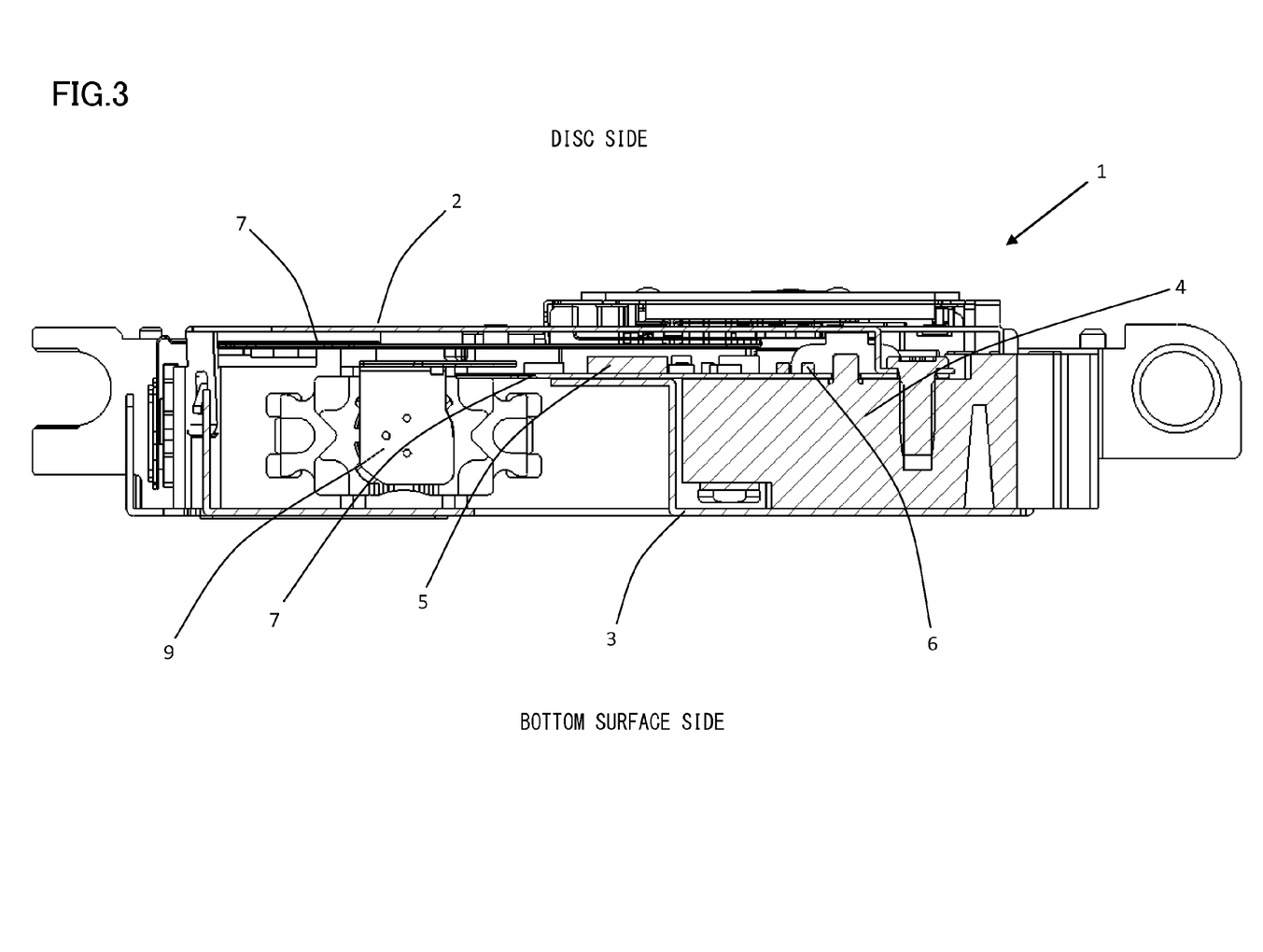
FIG. 3 is an A-A cross-sectional view of the optical pickup according to the first embodiment.

2. Structural Example of Optical Pickup 1 (FIG. 1, FIG. 3)

Hereinafter, a structure of the optical pickup 1 according to this embodiment will be described with reference to the drawings.

Figure 1:
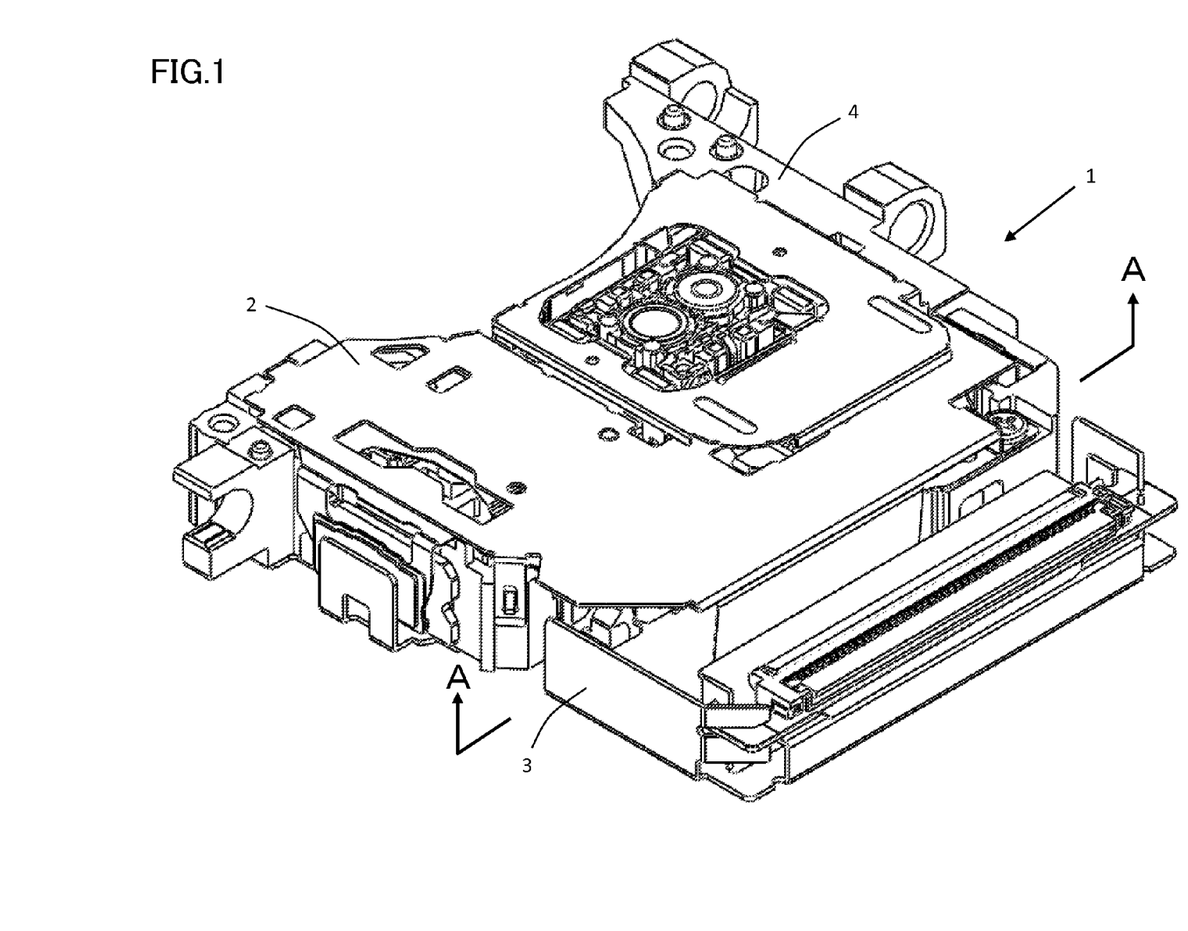
FIG. 1 is a perspective view of an optical pickup according to a first embodiment.
Figure 2:
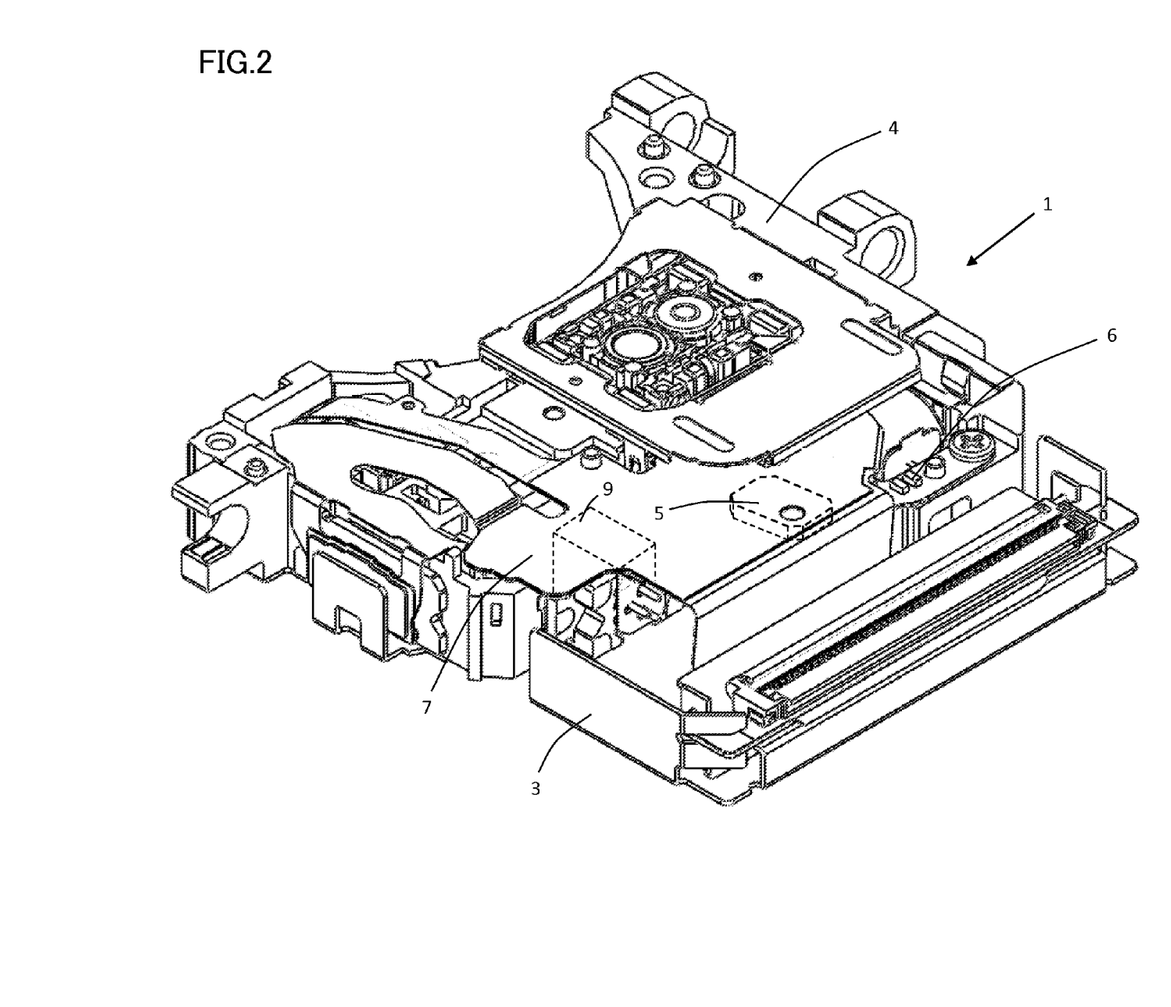
FIG. 2 is a perspective view of the optical pickup (without a first shielding case) according to the first embodiment.

FIG. 1 is a perspective view of the optical pickup 1. FIG. 2 is a perspective view of the optical pickup 1 in a state where a first shielding case 2 thereof is removed. FIG. 2 is a diagram illustrating the physical relationship among a drive IC 5, a temperature sensor 6, a flexible printed circuit board 7, and a laser light source 9. FIG. 3 is a diagram illustrating an A-A cross-sectional view of the optical pickup 1 according to this embodiment.

The optical pickup 1 is mounted in various apparatuses such as BD players, DVD recorders, and personal computers. The optical pickup 1 converts pit information embedded in an optical disc into electrical signals. The optical pickup 1 transmits the converted electrical signals to an optical disc unit.

With reference to FIG. 1 and FIG. 3, the optical pickup 1 includes the first shielding case 2, a second shielding case 3, a pickup-base 4, the drive IC 5, the temperature sensor 6, the flexible printed circuit board 7, a silicone member 8 (FIG. 7), and the laser light source 9. In this embodiment the structures of these components will be described in detail. However, the optical pickup 1 is not limited to these structures, but may be constituted by any structures that can realize the function of this embodiment. Hereinafter, the structures of individual components will be described in detail.

The pickup-base 4 is formed of a resin material. The pickup-base 4 is a foundation of the optical pickup 1. That is, the pickup-base 4 houses other components of the optical pickup 1. The optical pickup 1 includes a shaft engagement part which allows connection between the optical pickup 1 and a drive device. With the shaft engagement part, the position and inclination of the optical pickup 1 relative to the drive device is accurately maintained as shown. Because the pickup-base 4 is formed of resin, it is not suitable as a heat dissipation member.

The flexible printed circuit board 7 is formed of an insulative resin such as a polyimide, and a conductive material such as copper foil. The flexible printed circuit board 7 is fixed to the pickup-base 4 with screws. The flexible printed circuit board 7 is set to the pickup-base 4 to the disc side.

The flexible printed circuit board 7 is configured to be bendable. On the surface of the flexible printed circuit board 7, electrical components (such as the drive IC 5 and the temperature sensor 6), a photodetector, a light emitting device, and the like are mounted. In addition, on the surface of the flexible printed circuit board 7, circuit patterns are formed for connecting the electrical components, the photodetector, the light emitting device, and the like. Connector parts are also mounted to the flexible printed circuit board 7. The flexible printed circuit board 7 is configured to send electrical signals to the drive device via the connector parts.

Figure 4:
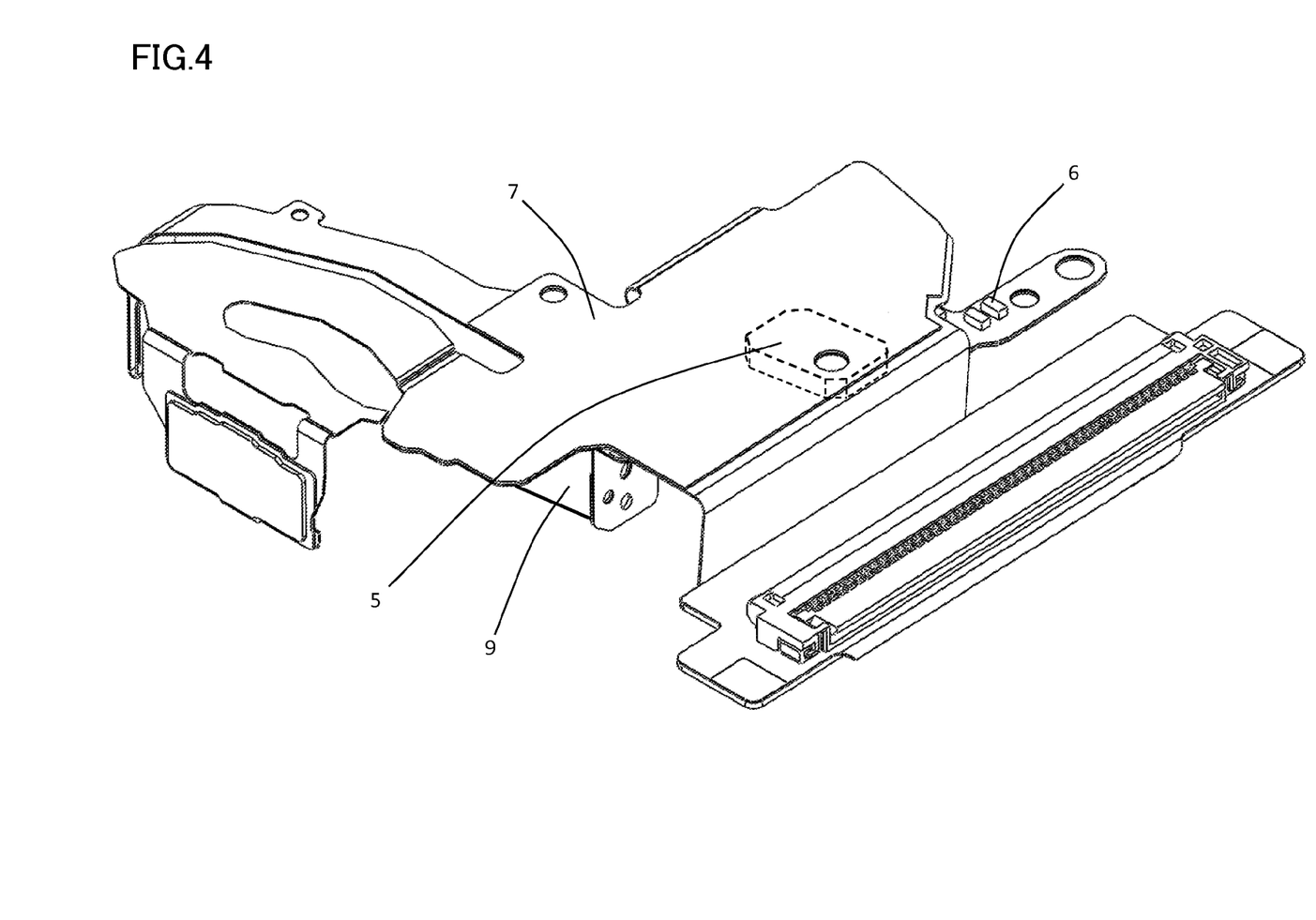
FIG. 4 is a perspective view of a flexible printed circuit board (which is bent) according to the first embodiment.

The flexible printed circuit board 7 is set to the pickup-base 4 in a bent state (FIG. 4). When the flexible printed circuit board 7 is set to the pickup-base 4, the drive IC 5 and the temperature sensor 6 are located such that their top panels face the disc side (FIG. 3). The drive IC 5 and the temperature sensor 6 are such arranged so as to achieve a suitable sensitivity of thermometry. As will be described later, the temperature sensor 6 measures the temperature of the outside air. Therefore, the temperature sensor 6 is preferably arranged in a portion as close to the outside of the product as possible.

The drive IC 5 is a semiconductor-based integrated circuit. The drive IC 5 is mounted to the flexible printed circuit board 7. The drive IC 5 is an integrated circuit for controlling the laser light source 9. The laser light source 9 generates laser beams for irradiating discs. The laser beams include the following types of beams: blue-violet (center wavelength of 405 nm), red (center wavelength of 650 nm), and infrared (center wavelength of 780 nm). The drive IC 5 and the laser light source 9 are examples of electronic components. The drive IC 5 and the laser light source 9 generate heat. In this embodiment, the drive IC 5 is an integrated circuit which has the largest heat discharge amount on the flexible printed circuit board 7, and the heat discharge amount is larger than that of the laser light source 9. It is noted that, as is clear from the drawings, the temperature sensor 6 is located closer in distance to the drive IC 5 than to the laser light source 9. Thus, in this embodiment, heat discharged from the drive IC 5 affects the temperature sensor 6 most significantly. However, a component that most significantly affects the temperature sensor 6 with its discharging heat may be any component that is arranged close to the temperature sensor 6, and is not limited to the drive IC 5 or the laser light source 9.

The temperature sensor 6 measures the temperature of the surrounding air. Depending on the temperature, the contact point of the temperature sensor 6 operates, or the resistance thereof changes. The temperature sensor 6 can be realized, for example, by using a bimetal metal or by mounting a semiconductor device. Accordingly, in the optical pickup 1, depending on the temperature (represented by electrical signal) detected by the temperature sensor 6, light emission power of the laser light source 9 (light emitting device) can be controlled, or correction of aberration in the optical components can be controlled. The temperature sensor 6 is used for such controls, and thus accurate detection, by the temperature sensor 6, of the temperature of the surrounding air (outside temperature) is required in the optical pickup 1.

Figure 5:
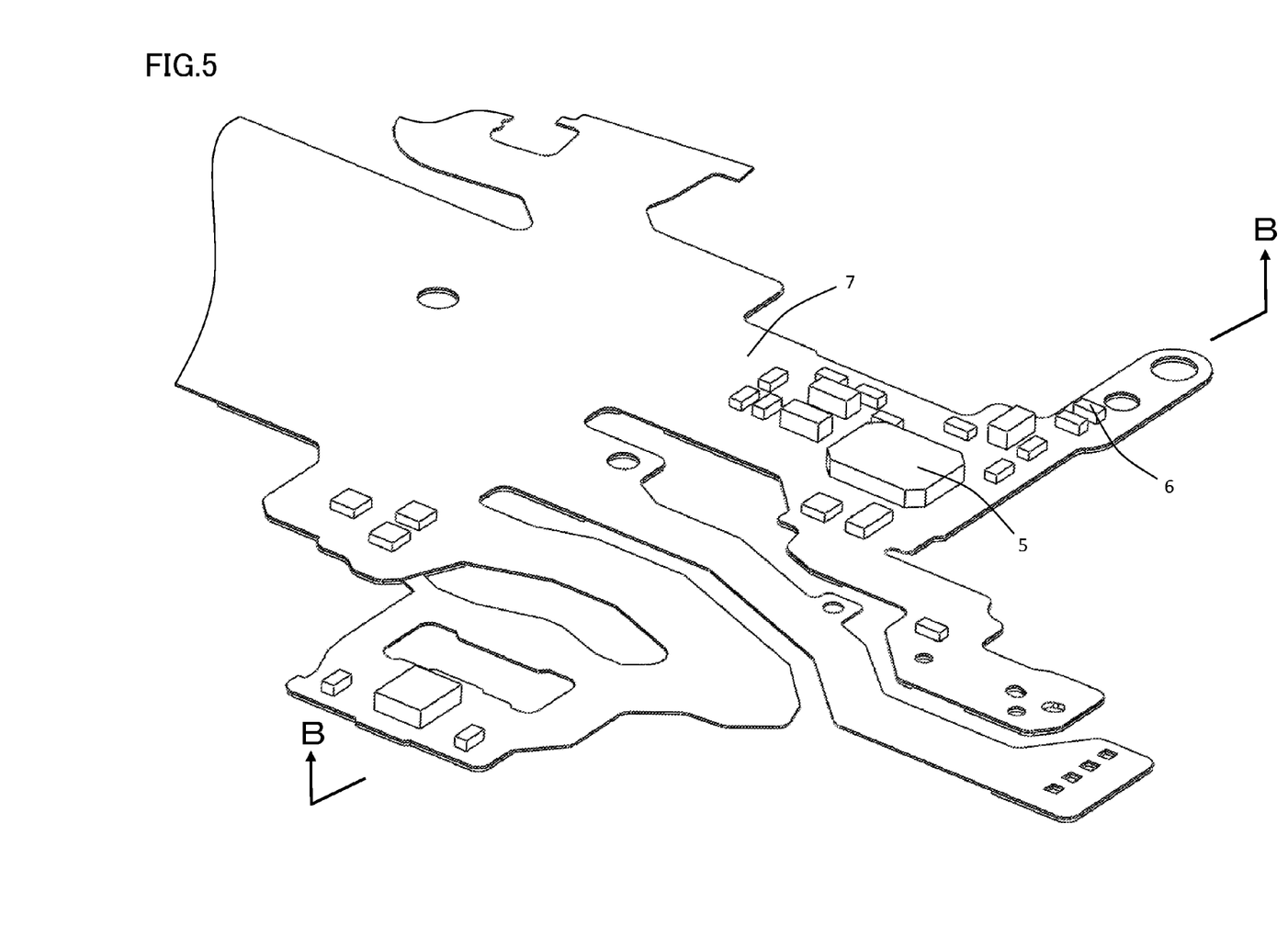
FIG. 5 is a perspective view of the flexible printed circuit board (which is not bent) according to the first embodiment.
Figure 6:
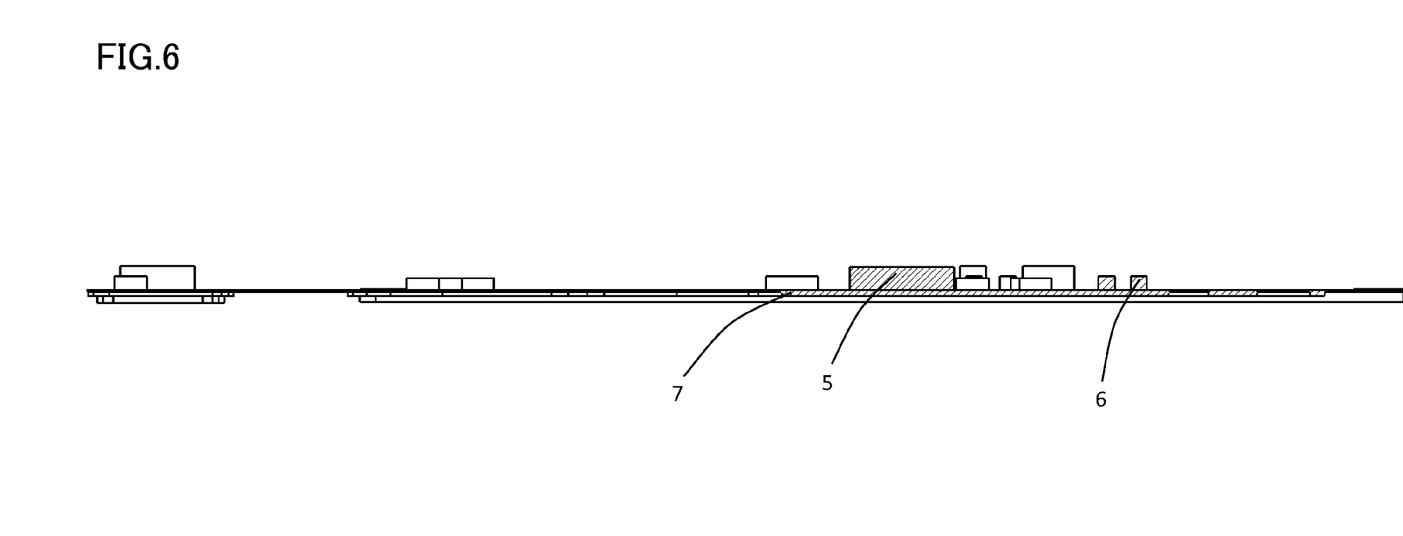
FIG. 6 is a B-B cross-sectional view of the flexible printed circuit board according to the first embodiment.

The temperature sensor 6 is mounted on the flexible printed circuit board 7. The temperature sensor 6 is mounted on the same surface on which the drive IC 5 is mounted (FIG. 5 and FIG. 6). The drive IC 5 and the temperature sensor 6 are mounted on one surface of the flexible printed circuit board 7 since their mounting on both sides may cause increase in costs or upsizing of the product.

The first shielding case 2 is formed of metal (e.g., a stainless steel plate). The first shielding case 2 is provided on the disc side relative to the pickup-base 4 and the flexible printed circuit board 7. The first shielding case 2 is fixed to the pickup-base 4 in an engaged manner, with screws. Specifically, the first shielding case 2 is arranged so as to engage the pickup-base 4, and then fixed with screws.

The first shielding case 2 is provided in a manner so as to cover the pickup-base 4 and the flexible printed circuit board 7. Accordingly, the first shielding case 2 prevents the attachment of dust and dirt to the light emitting device, the photodetector, and the like. In addition, the first shielding case 2 plays a role of dissipating heat discharged from the drive IC 5.

Further, the first shielding case 2 is provided in a manner as to cover the temperature sensor 6. Thus, increases in the temperature of the first shielding case 2 result in the temperature sensor 6 not being able to accurately measure the temperature of the surrounding air.

The second shielding case 3 is formed of metal (e.g., a galvanized steel plate). The second shielding case 3 is provided to the bottom surface side relative to the pickup-base 4. The second shielding case 3 is fixed to the pickup-base 4 in an engaged manner, with screws. Specifically, the second shielding case 3 is arranged so as to engage the pickup-base 4, and then fixed with screws. As described above, the first shielding case 2 is formed of a stainless steel plate, and the second shielding case 3 is formed of a galvanized steel plate. The thermal conductivity of the galvanized steel plate is higher than the thermal conductivity of the stainless steel plate. Thus, heat tends to flow toward the second shielding case 3 rather than toward the first shielding case 2.

The second shielding case 3 is provided in a manner so as to cover the pickup-base 4. Accordingly, the second shielding case 3 prevents attachment of dust and dirt to the light emitting device, the photodetector, and the like. In addition, the second shielding case 3 plays a role of dissipating heat discharged from the drive IC 5. As described above, due to the difference in thermal conductivity, the second shielding case 3 has higher heat dissipation performance than the first shielding case 2.

Figure 7:
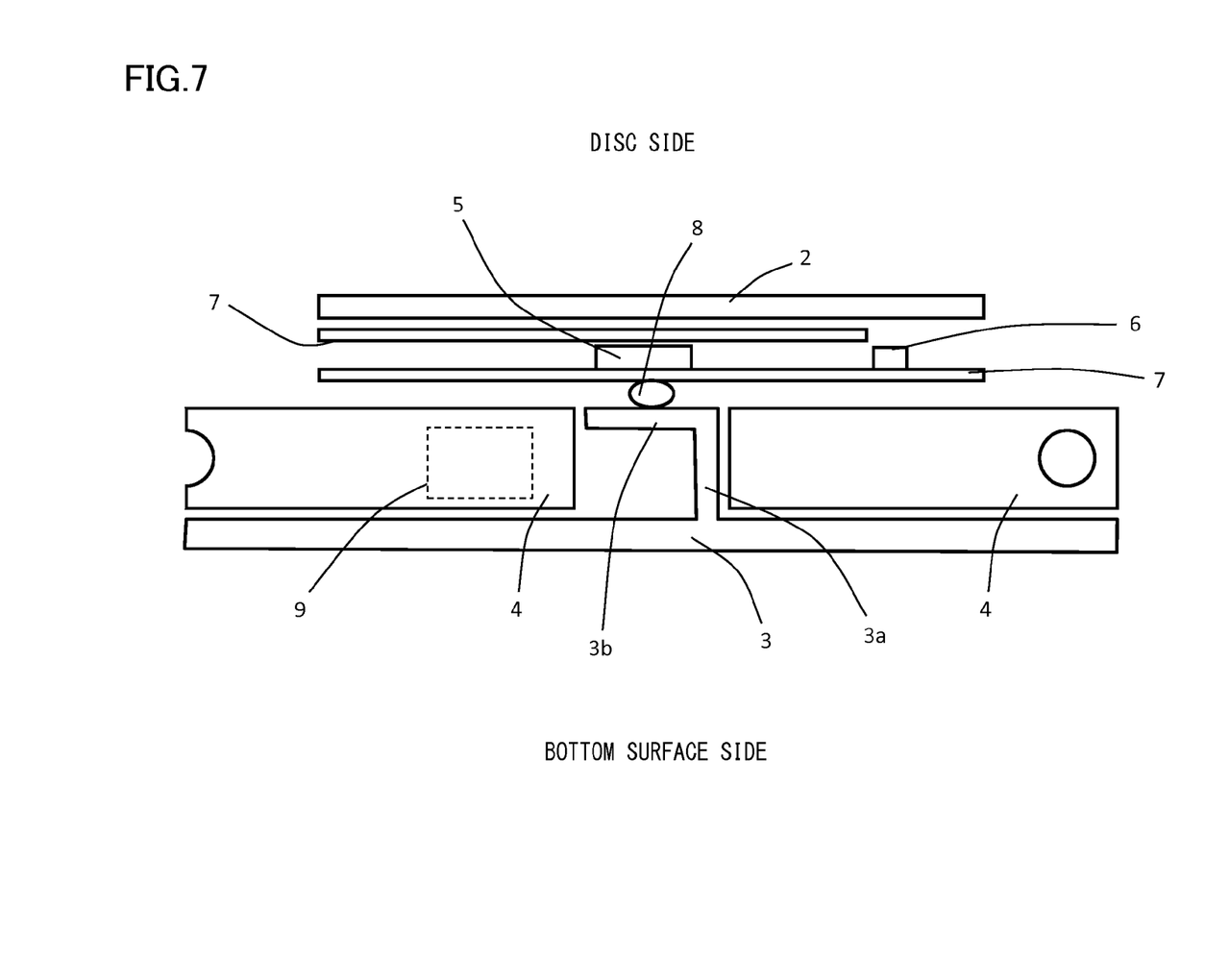
FIG. 7 is a schematic diagram illustrating a cross-section of the optical pickup according to the first embodiment.

As described above, the second shielding case 3 is provided to the bottom surface side of the pickup-base 4. Here, structural characteristics of the second shielding case 3 will be described. As illustrated in FIG. 7, the second shielding case 3 has, as a structure for dissipating heat discharged from the drive IC 5, an arm 3a extending from the bottom surface side of the pickup-base 4 through an opening in a substantially central portion of the pickup-base 4 in the illustrated embodiment. Further, from the extending arm 3a, a horizontal flat portion 3b extends opposing the drive IC 5 having the flexible printed circuit board 7 interposed therebetween. That is, the second shielding case 3 includes the arm 3a which stands from the bottom of the second shielding case 3, and the horizontal flat portion 3b which is at a substantially right angle to the arm 3a. The length (and the area) of the horizontal flat portion 3b is larger than the length (and the area) of the drive IC 5. In this manner, heat discharged from the drive IC 5 flows to the arm 3a via the horizontal flat portion 3b which has a larger area than the contact surface of the drive IC 5, and thus the second shielding case 3 can allow heat discharged from the drive IC 5 to escape efficiently. It is noted that the arm 3a and the horizontal flat portion 3b are examples of an extension part.

Figure 11A:
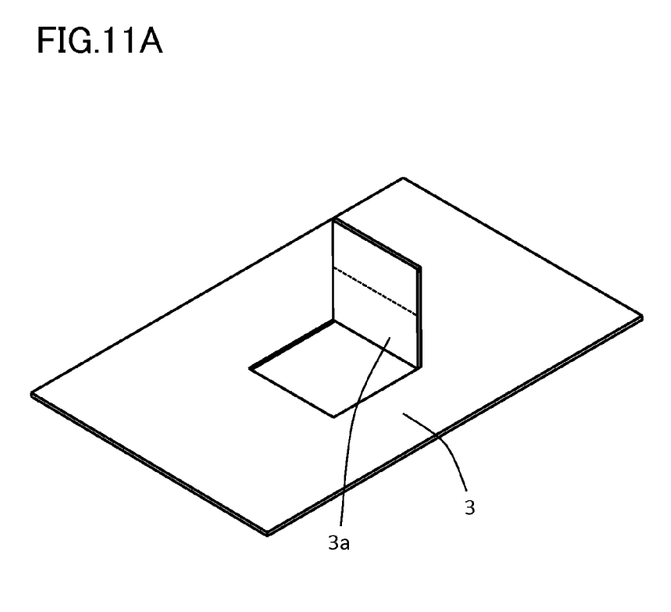
FIG. 11A and FIG. 11B are each a diagram for explanation of a state of manufacturing a second shielding case according to the first embodiment.
Figure 11B:
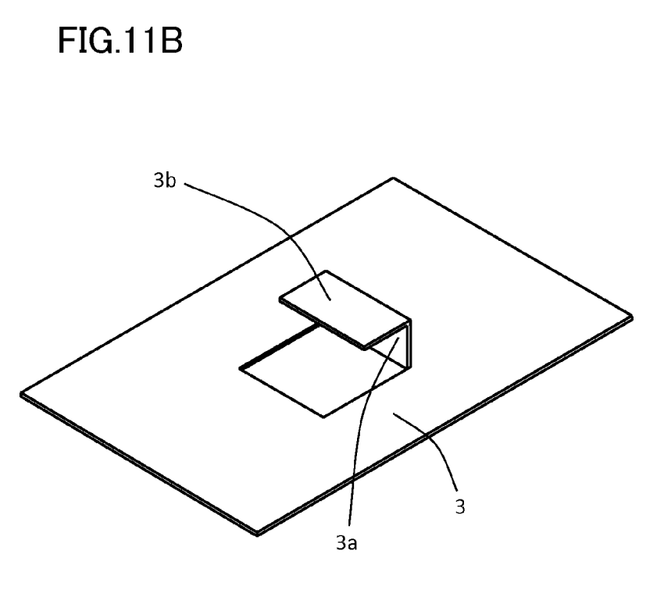

The second shielding case 3 including such structural characteristics is manufactured from a sheet of galvanized steel through a bending process (pressing process). The manufacturing process will be described with reference to FIG. 11A and FIG. 11B. FIG. 11A and FIG. 11B are each a perspective view schematically illustrating the second shielding case 3. These diagrams schematically illustrate only a part of the second shielding case 3 so as to explain the technical feature of this embodiment rather than illustrating the whole of the actual second shielding case 3 in detail. When the bending process is composed of two processes, the extension part is bent in a state illustrated in FIG. 11A, and then bent in a state illustrated FIG. 11B. It is noted that when the bending process is composed of one process, the extension part is bent from a plane state into a state illustrated in FIG. 11B (without having the state in FIG. 11A) in a single process.

In a predetermined position of a thin flat plate, three sides of a quadrangle portion are cut out while one side thereof is left intact. The quadrangle portion is bent along the left one side, and thereby the arm 3a stands up as illustrated in FIG. 11A. Further, the quadrangle portion is bent along the dotted line in FIG. 11A, and thereby the horizontal flat portion 3b is formed which is parallel or substantially parallel to the original flat plate, as illustrated in FIG. 11B.

On the horizontal flat portion 3b formed as above (between the horizontal flat portion 3b and the flexible printed circuit board 7), a silicone member 8 is provided. The silicone member 8 enhances adhesion, and also allows heat from the drive IC 5 to escape to other members very effectively due to its high thermal conductivity. The silicone member 8 is provided between the second shielding case 3 and the drive IC 5 (having the flexible printed circuit board 7 therebetween) instead of being arranged between the first shielding case 2 and the drive IC 5. Accordingly, in this embodiment, the silicone member 8 enhances heat transfer between the second shielding case 3 and the drive IC 5, but does not enhance heat transfer between the first shielding case 2 and the drive IC 5. As a result, heat discharged from the drive IC 5 tends to flow toward the second shielding case 3 instead of the first shielding case 2 where the temperature sensor 6 is provided. Accordingly, the temperature sensor 6 becomes less subjected to the influence of heat discharged from the drive IC 5.

3. Heat Transfer Path

Figure 8:
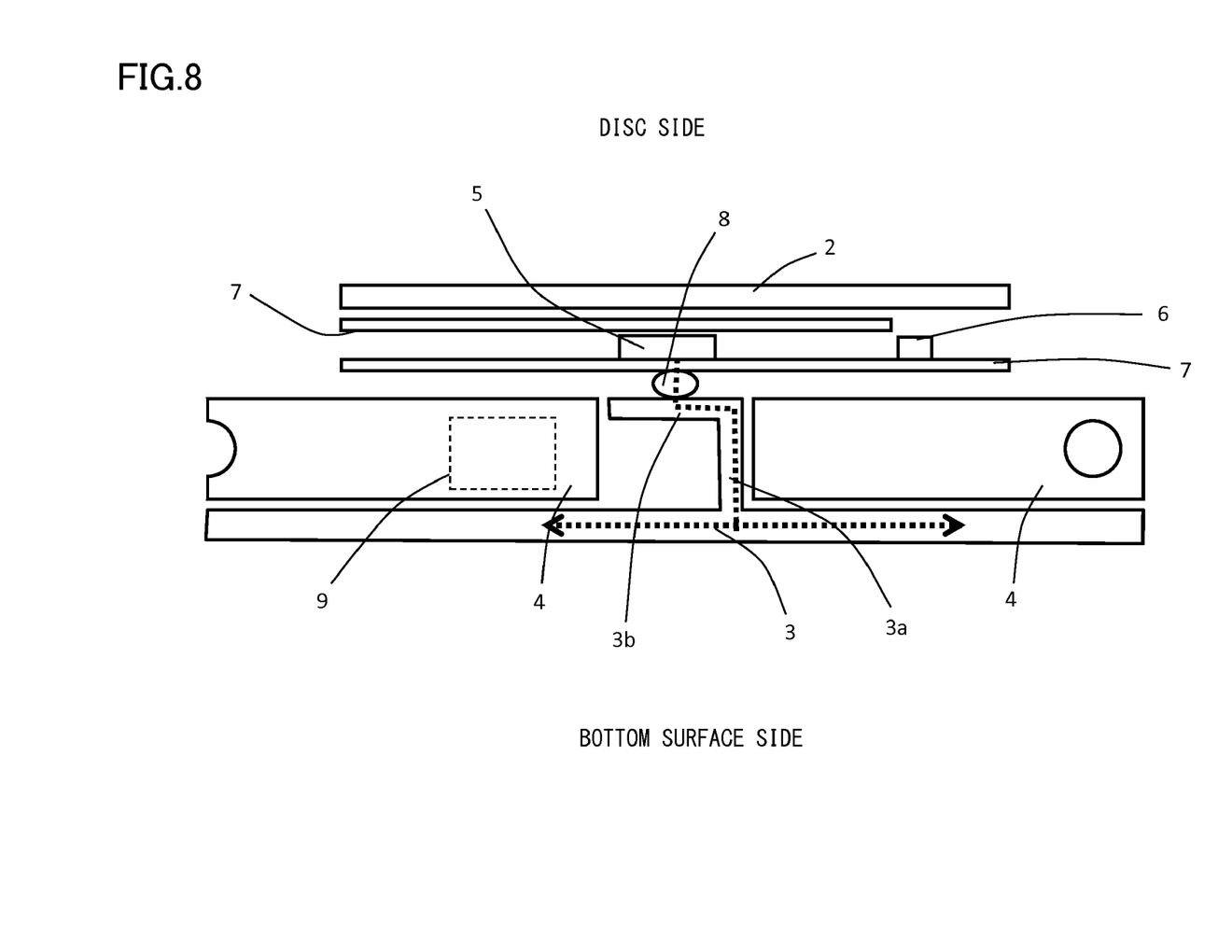
FIG. 8 is a diagram illustrating flow of heat in the optical pickup according to the first embodiment.

Next, a transfer path of heat discharged from the drive IC 5 of the optical pickup 1 in this embodiment will be described with reference to FIG. 8. It is noted that, for the sake of easy understanding of this embodiment, an undesirable structure will be described with reference to FIG. 9, and a transfer path of heat in the undesirable structure will be described with reference to FIG. 10.

3.1 Example of Undesirable Structure that Causes Problems

Figure 9:
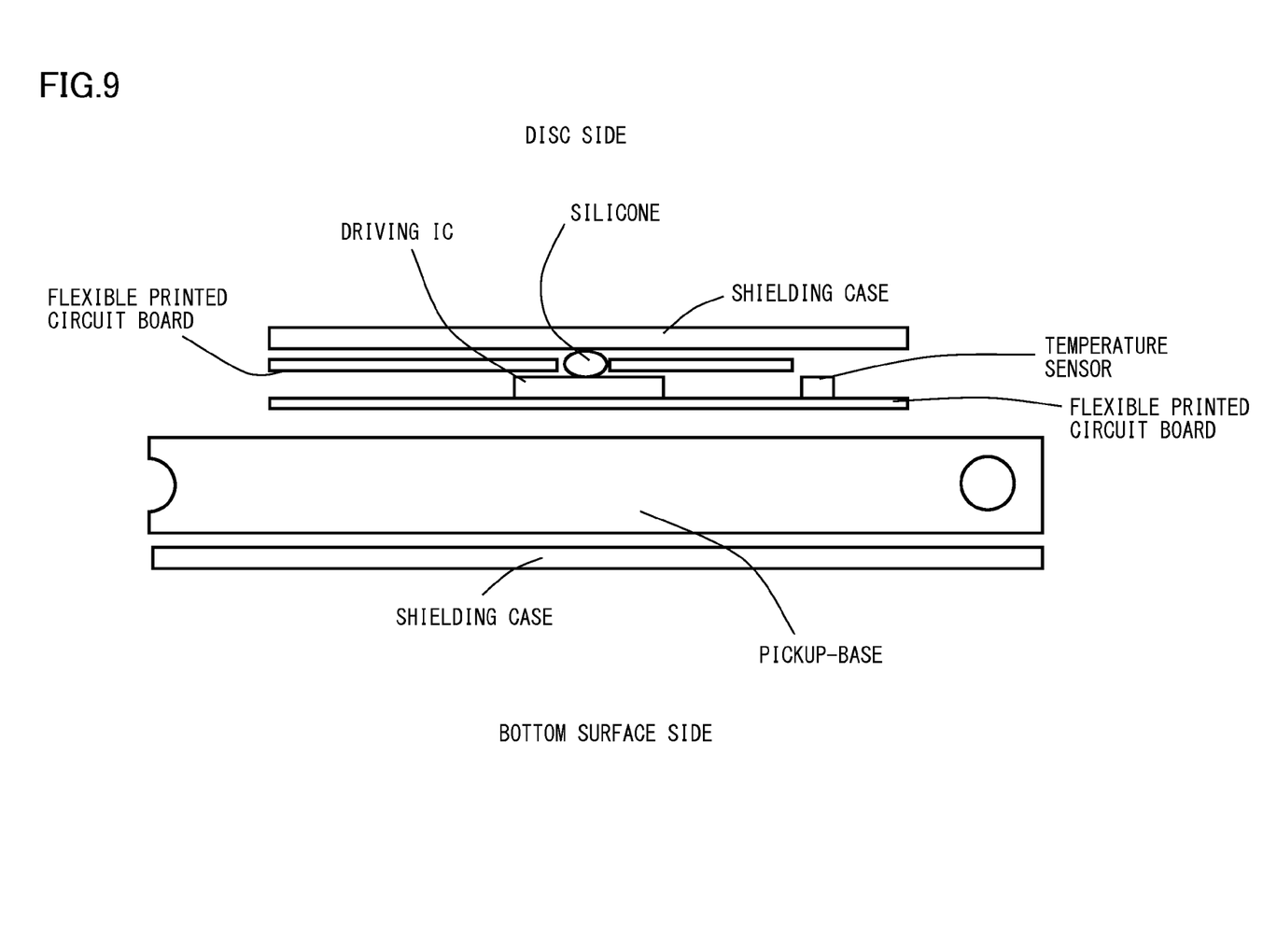
FIG. 9 and FIG. 10 are each a diagram for explanation of a problem of the optical pickup.

As illustrated in FIG. 9, an optical pickup having such an undesirable structure includes a flexible printed circuit board to the disc side relative to the pickup-base, like in this embodiment. To the disc side from the flexible printed circuit board, a drive IC and a temperature sensor are mounted, like in this embodiment. In order to minimize the influence of heat generated in the drive IC on the temperature sensor, this optical pickup also has a structure which lets the heat from the drive IC escape. Specifically, the shielding case and the drive IC are connected to each other by having a silicone member interposed therebetween.

Figure 10:
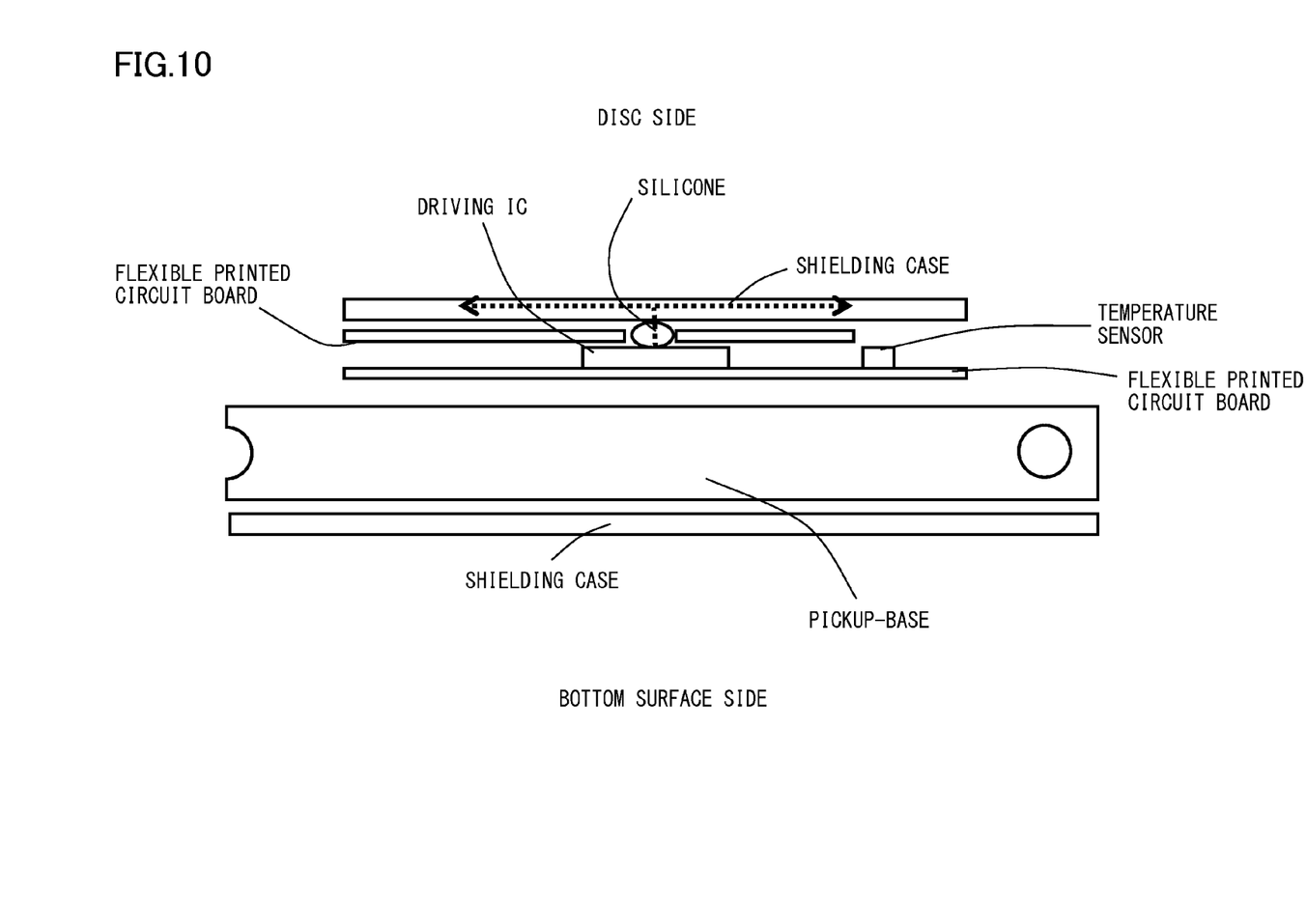

Flow of heat in such a structure will be described with reference to FIG. 10. As illustrated in FIG. 10, heat generated in the drive IC transfers to the shielding case to the disc side through the silicone member. The heat having transferred is dissipated in the air from the shielding case, whereby heat dissipation is realized.

Heat dissipation like this increases the temperature of the shielding case. Thus, due to the effect of the increased temperature of the shielding case, it is highly likely that the temperature sensor fails to accurately measure the temperature of the surrounding air (temperature of the outside air).

3.2 Example of Structure of this Embodiment

As illustrated in FIG. 7, the optical pickup 1 of this embodiment includes the flexible printed circuit board 7 to the disc side relative to the pickup-base 4. To the disc side from the flexible printed circuit board 7, the drive IC 5 and the temperature sensor 6 are mounted. In order to minimize the influence of heat generated by the drive IC 5 on the temperature sensor, this optical pickup 1 also has a structure which lets the heat from the drive IC 5 escape. Specifically, the second shielding case 3 and the drive IC 5 (having the flexible printed circuit board 7 therebetween) are connected to each other by means of the silicone member 8 interposed therebetween.

It is noted that, in this optical pickup 1, in order prevent heat generated in the drive IC 5 from flowing to the first shielding case 2 side, the first shielding case 2 and the drive IC 5 are not connected to each other by means of a silicone member (a silicone member is not located therebetween). In addition, the material of the second shielding case 3 and that of the first shielding case 2 are determined such that the thermal conductivity of the second shielding case 3 is higher than that of the first shielding case 2. Specifically, as described above, the material of the first shielding case 2 is a stainless steel plate, and the material of the second shielding case 3 is a galvanized steel plate.

Flow of heat in such a structure will be described with reference to FIG. 8. As illustrated in FIG. 8, heat generated in the drive IC 5 transfers to the second shielding case 3 through the flexible printed circuit board 7 and the silicone member 8. The transferred heat is dissipated in the air from the second shielding case 3, whereby heat dissipation is realized. It is noted that in this embodiment, heat hardly transfers to the first shielding case 2. Thus, as compared to the undesirable structure, the amount of heat flowing from the drive IC 5 to the first shielding case 2 can be reduced significantly. As a result, it is possible to significantly reduce the influence of heat on the temperature sensor 6.

Accordingly, in the optical pickup 1 according to this embodiment, it is possible to significantly reduce the influence of heat of the first shielding case 2 on the temperature sensor 6 as compared to the optical pickup having the undesirable structure.

Modified Example of First Embodiment

It is noted that, in the above-described embodiment, the first shielding case 2 and the drive IC 5 are not connected to each other by means of a silicone member interposed therebetween (a silicone member is not located therebetween). However, depending on the amount of heat discharged from the drive IC 5, the amount of heat transferring to the second shielding case 3, or the like, the first shielding case 2 and the drive IC 5 may be connected by means of a silicone member interposed therebetween on condition that a rise in temperature of the first shielding case 2 does not affect the temperature sensor 6. With this arrangement, heat generated in the drive IC 5 can be sufficiently dissipated even in the case where the second shielding case 3 cannot sufficiently release heat. As a result, it is possible to reduce the influence of heat generated in the drive IC 5 on the temperature sensor 6.

Second Embodiment

Hereinafter, with reference to FIG. 12, a second embodiment of the present invention will be described. It is noted that in all the embodiments including this embodiment, an optical pickup is used as an example of electronic devices. The same components as in the first embodiment are denoted by the same reference numerals. The functions thereof are also the same as those in the first embodiment. Thus, detailed description of those components will not be repeated hereinbelow.

Figure 12:
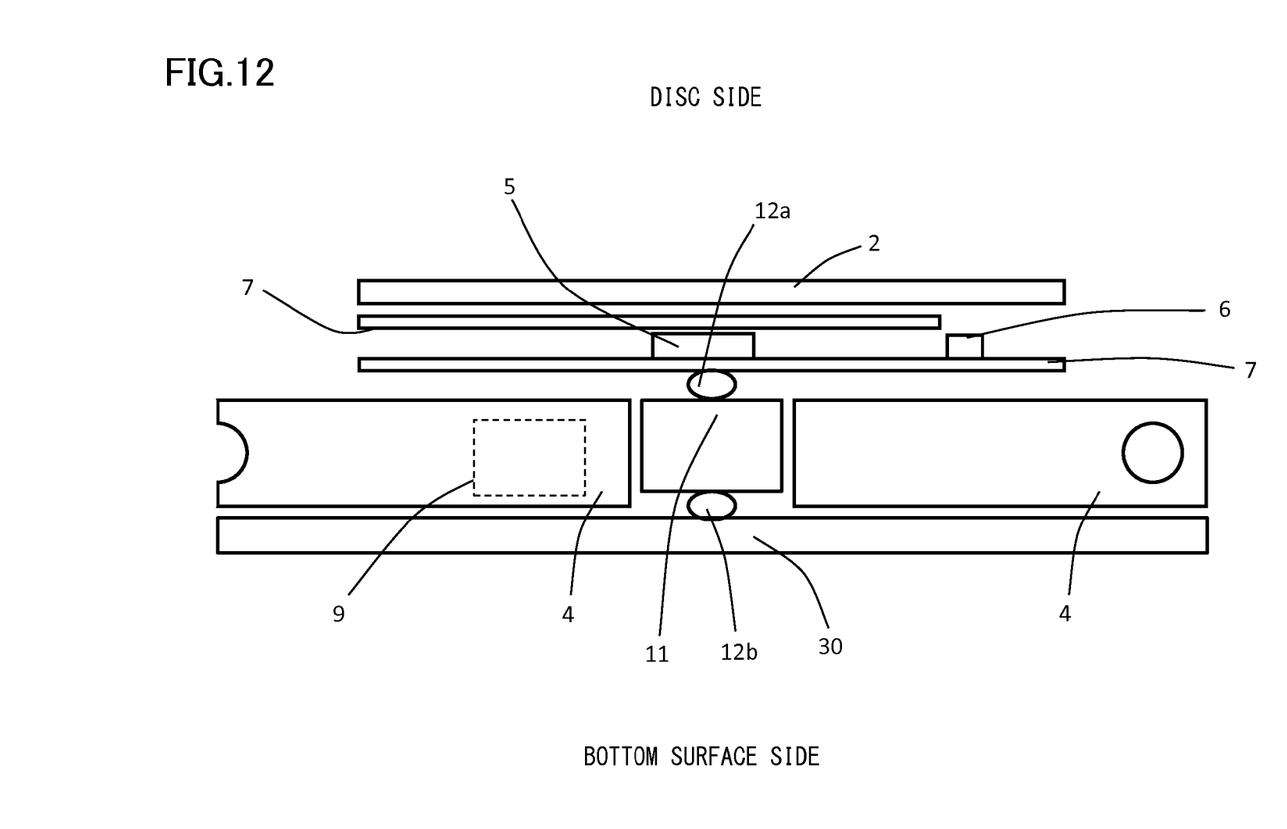
FIG. 12 is a schematic diagram illustrating a cross-section of an optical pickup according to a second embodiment.

As illustrated in FIG. 12, in this embodiment, a second shielding case 30 does not have a shape described according to FIG. 7 and FIG. 11. The second shielding case 30 is a flat member that does not have the arm 3a or horizontal flat portion 3b. Other than this, the second shielding case 30 has the same structure as the second shielding case 3. In this embodiment, a heat conduction member 11 is provided between the second shielding case 30 and the drive IC 5 (having the flexible printed circuit board 7 therebetween).

The heat conduction member 11 is, for example, a member which has a rectangular parallelepiped shape and is made of a material having a thermal conductivity similar to that of the second shielding case 30. The length (and area) of the heat conduction member 11 surface that opposes the drive IC 5 is larger than the length (and area) of the surface of the drive IC 5. Further, a silicone member 12a is provided on the heat conduction member 11 between the upper surface of the heat conduction member 11 and the flexible printed circuit board 7, and a silicone member 12b is provided under the heat conduction member 11 between the lower surface of the heat conduction member 11 and the second shielding case 30. Like the silicone member 8, the silicone member 12a and the silicone member 12b have high thermal conductivity, and let the heat from the drive IC 5 escape to other members highly effectively. It is noted that no silicone member is provided between the first shielding case 2 and the drive IC 5 like in the first embodiment.

In this manner, heat generated in the drive IC 5 flows to the heat conduction member 11 whose upper surface area is larger than the contact surface area of the drive IC 5, and thus the second shielding case 3 can let the heat generated in the drive IC 5 escape effectively. This embodiment is preferable in that the heat conduction member 11 can be placed on the second shielding case 30 without performing a bending process for the second shielding case 3 illustrated in FIG. 11.

Third Embodiment

Figure 13:
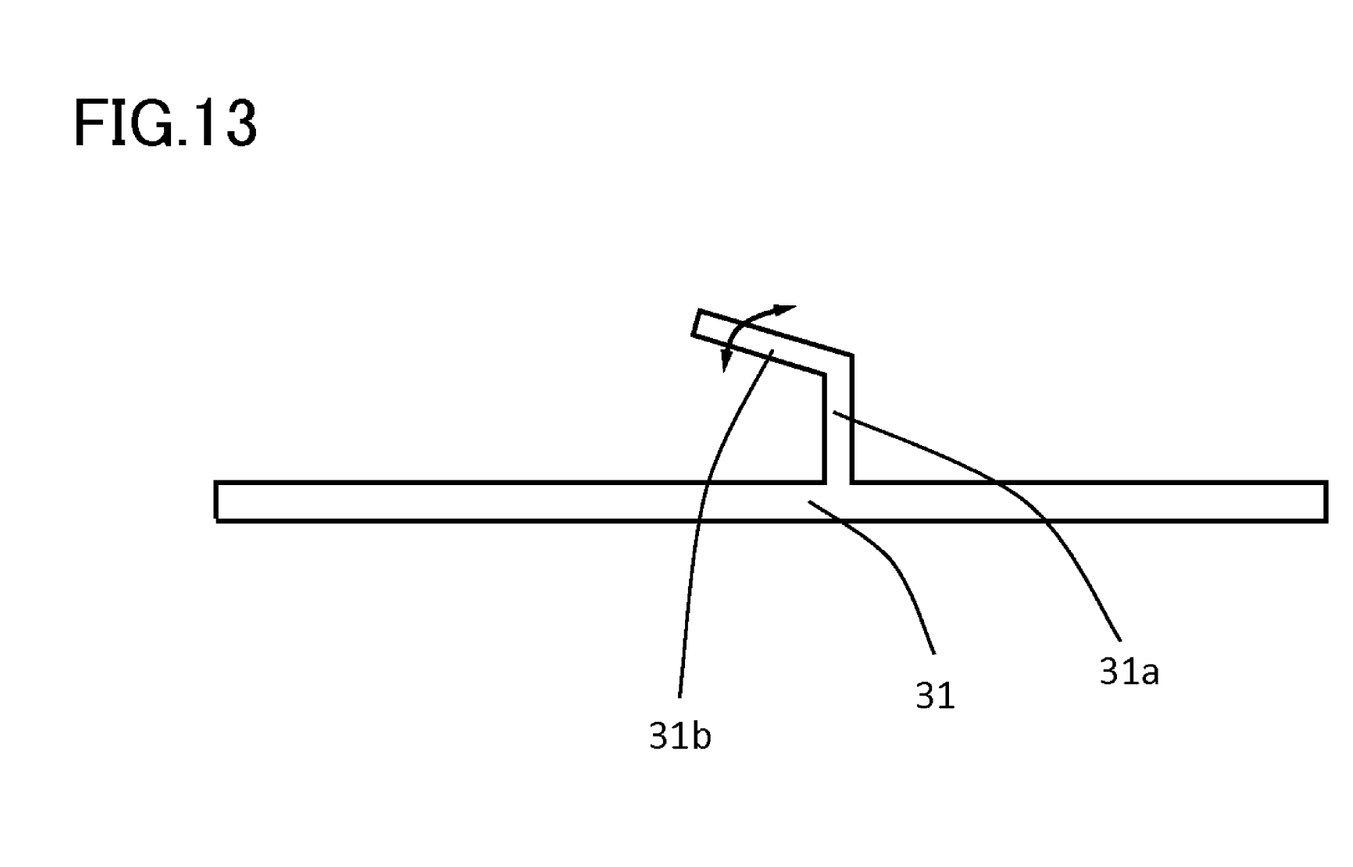
FIG. 13 is a schematic diagram illustrating a cross-section of a second shielding case of an optical pickup according to a third embodiment.

Hereinafter, with reference to FIG. 13, a third embodiment of the present invention will be described. As illustrated in FIG. 13, a second shielding case 31 according to this embodiment has a structure similar to that of the second shielding case 3 according to the first embodiment. A horizontal flat portion 31b of the second shielding case 31 is different in that it is formed of material which is elastically deformable so as to tightly adhere to the flexible printed circuit board 7 (and which has higher thermal conductivity than the first shielding case 2). The length (and area) of the horizontal flat portion 31b of the second shielding case 31 is the same as that of the second shielding case 3.

FIG. 13 illustrates a state of the second shielding case 31 before it is mounted in an optical pickup. The horizontal flat portion 31b of the second shielding case 31 exhibits elasticity in the directions shown with the arrows, and upon its mounting in the optical pickup, the horizontal flat portion 31b tightly adheres to the flexible printed circuit board 7 due to its elasticity. In this manner, this embodiment is preferable in that the silicone member 8 is not required since adhesion between the horizontal flat portion 31b and the flexible printed circuit board 7 is high.

Fourth Embodiment

Figure 14:
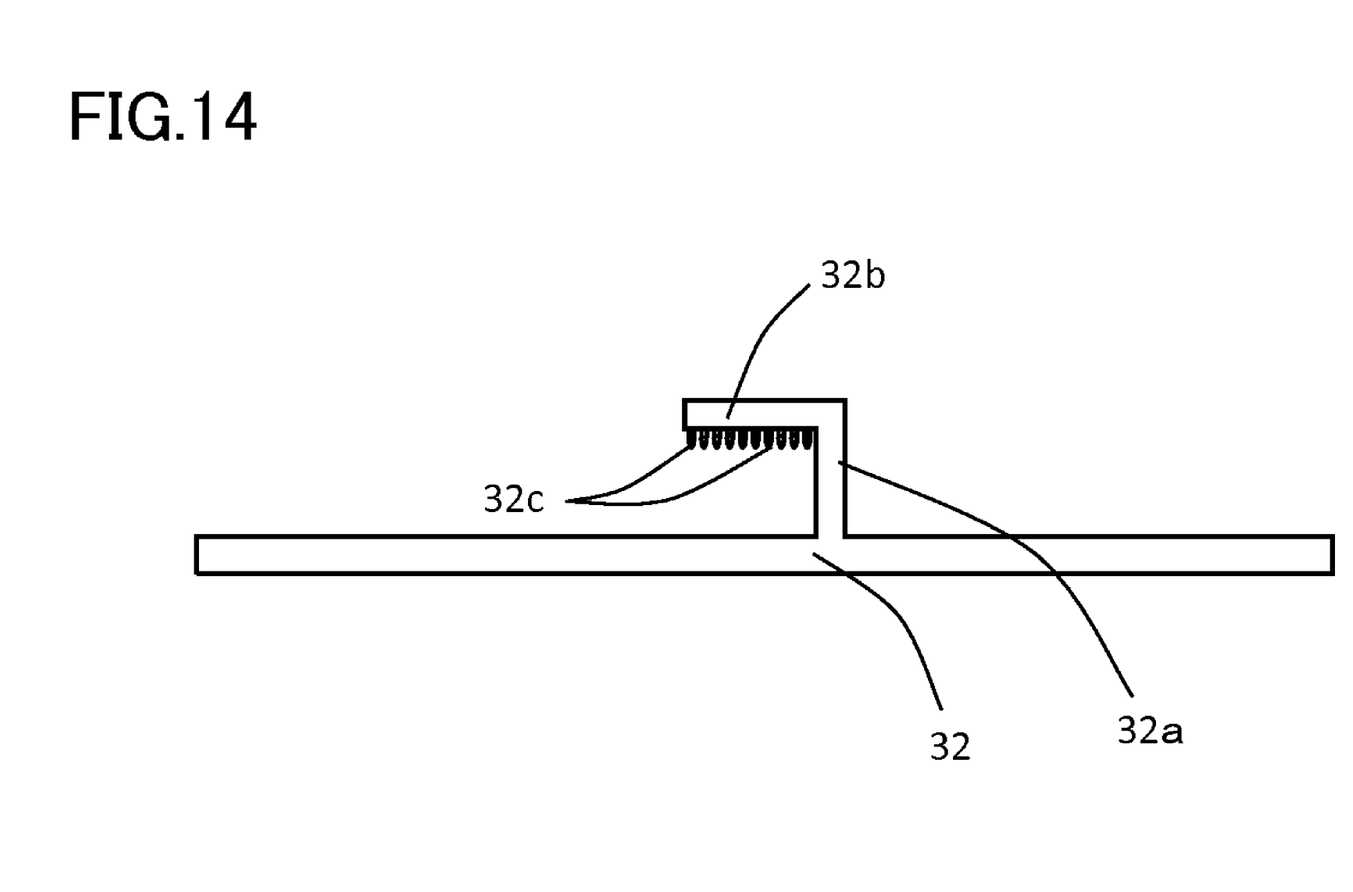
FIG. 14 is a schematic diagram illustrating a cross-section of a second shielding case of an optical pickup according to a fourth embodiment.

Hereinafter, with reference to FIG. 14, a fourth embodiment of the present invention will be described. As illustrated in FIG. 14, a second shielding case 32 according to this embodiment has a structure similar to that of the second shielding case 3 according to the first embodiment. The second shielding case 32 is different in that a horizontal flat portion 32b thereof has heat dissipation fins 32c. The length (and area) of the upper surface of the horizontal flat portion 32b of the second shielding case 32 is the same as the length (and area) of the surface of the second shielding case 3.

As illustrated in FIG. 14, with the heat dissipation fins 32c provided on the lower surface of the horizontal flat portion 32b of the second shielding case 32, heat transferred from the drive IC 5 through the flexible printed circuit board 7 and the silicone member 8 is dissipated efficiently. Thus, it is possible to prevent the heat generated in the drive IC 5 from affecting the temperature sensor 6.

Other Embodiments

As described above, the first to fourth embodiments have been described as embodiments of the present invention. However, the present invention is not limited to these. Now, other embodiments of the present invention will be described hereinafter collectively. It should be noted that the present invention is not limited to the following embodiments, but is applicable to any appropriately modified embodiments.

In the above-described embodiments, the drive IC 5 has been described as an integrated circuit that has the largest heat discharge amount on the flexible printed circuit board 7. Without limitation to this, the integrated circuit (an example of electronic components) that will be a heat source may be any heat discharging member. That is, the integrated circuit that will be a heat source need not be a member that has the largest heat discharge amount on the flexible printed circuit board. For example, the second shielding case 3 may have a structural characteristic of effectively dissipating heat generated by an electronic circuit that does not have the largest heat discharge amount but is arranged closer to the temperature sensor 6.

In the above-described embodiment, the pickup-base 4 is formed of a resin material. However, without limitation to this, the pickup-base 4 may be formed of a metallic material. It is noted that the pickup-base 4 formed of resin material has the following advantages. Firstly, the cost of the optical pickup 1 will be reduced. Secondly, the weight of the optical pickup 1 will be reduced.

In the above embodiment, the second shielding case 3 is formed of metal. However, without limitation to this, the second shielding case 3 may be formed of a graphite sheet, or a high heat conductivity resin. In the case where the second shielding case 3 is realized by a graphite sheet, the weight of the optical pickup 1 will be reduced.

In the above-described first embodiment, the silicone member 8 is arranged between the second shielding case 3 and the drive IC 5. In addition, in the modified example of the first embodiment, an additional silicone member is arranged between the first shielding case 2 and the drive IC 5. However, without limitation to this, the silicone member 8 need not be arranged. In addition, instead of the silicone member 8, a graphite sheet may be arranged. That is, any member may be arranged between the shielding case and the drive IC as long as the member is formed of a material having high thermal conductivity.

In the above-described embodiments, the flexible printed circuit board 7 is formed of a bendable board. However, the present invention is not limited to this.

In the above-described embodiments, the optical pickup has been described as an example of the electronic devices. However, the present invention is not limited to this, and any device may be used as the electronic devices as long as the device has a temperature sensor.

As described above, various embodiments have been illustrated, and the present invention is not limited to these embodiments, but includes further various embodiments.

What is claimed is:

1. An electronic device, comprising:
   a base formed of a resin material;
   a board which is disposed at one side of the base, and includes an electronic component and a temperature sensor; and
   a heat sink which is disposed at the other side of the base for dissipating heat generated by the electronic component, wherein
   the heat sink includes an extension part extending from the other side of the base toward a position of the board at which the electronic component is provided.

2. The electronic device according to claim 1, wherein
   the temperature sensor and the electronic component are arranged on the same surface of the board, and
   the board is located such that the temperature sensor and the electronic component are not arranged to the base side relative to the board.

3. The electronic device according to claim 1, wherein
   the extension part of the heat sink is a cutout part of a planar shaped metal plate, and the cutout part is bent.

4. The electronic device according to claim 1, wherein
   the extension part of the heat sink includes:
   an arm extending toward the electronic component; and
   a horizontal flat portion which extends from the arm and has a surface opposing the electronic component.

5. The electronic device according to claim 4, wherein due to elastic force of the arm, the horizontal flat portion is in contact with and pressed to the board toward the electronic component.

6. The electronic device according to claim 4, wherein the horizontal flat portion includes heat dissipation fins on a surface thereof opposite to the surface opposing the electronic component.

7. The electronic device according to claim 4, wherein the area of the horizontal flat portion is larger than the area of the electronic component.

8. The electronic device according to claim 1, further comprising
   a shielding case arranged to the side of the board relative to the base, so as to cover the temperature sensor, wherein
   the shielding case has lower thermal conductivity than the heat sink.

9. The electronic device according to claim 1, further comprising
   a light source radiating light, wherein
   the electronic component is a component part for controlling the light source.

* * * * *